United States Patent [19]

Maurer et al.

[11] 4,317,231
[45] Feb. 23, 1982

[54] MICROWAVE CIRCUIT FOR A PARAMETRIC UPPER SIDEBAND DOWN CONVERTER

[75] Inventors: Robert Maurer, Saarbrücken; Walter Schau, Dudweiler, both of Fed. Rep. of Germany

[73] Assignee: Licentia Patent-Verwaltungs-G.m.b.H., Frankfurt am Main, Fed. Rep. of Germany

[21] Appl. No.: 113,265

[22] Filed: Jan. 18, 1980

[30] Foreign Application Priority Data

Jan. 18, 1979 [DE] Fed. Rep. of Germany ....... 2901782

[51] Int. Cl.³ .......................... H04B 1/26; H03F 7/04
[52] U.S. Cl. .................................. 455/330; 307/424; 330/4.9; 455/331
[58] Field of Search ............... 455/323, 325, 330, 331, 455/341; 330/4.5, 4.9; 307/424

[56] References Cited

U.S. PATENT DOCUMENTS 3,070,751 12/1962 Vigiano ................................. 330/4.9
3,991,373 11/1976 Maurer et al. ........................ 330/4.9
4,138,648 2/1979 Hudspeth et al. .................... 330/4.9
4,158,817 6/1979 Löcherer ............................. 455/331

Primary Examiner—Marc E. Bookbinder
Attorney, Agent, or Firm—Spencer & Kaye

[57] ABSTRACT

In a microwave circuit for a parametric upper sideband down converter with real image frequency termination conductance, including a pump circuit supplying a pump signal, a parallel circuit at its input, an intermediate frequency circuit at its output, and a reactance diode coupling the parallel circuit and intermediate frequency circuit together, the parallel circuit is tuned approximately to the frequency of the pump signal; the intermediate frequency circuit is composed of a $\pi$ filter having a series branch containing a first inductance connected in series between the diode and the output of the microwave circuit, a first shunt branch located between the diode and the inductance and containing a first capacitance and a second shunt branch located between the inductance and the output of the microwave circuit and containing a second capacitance; the microwave circuit further includes a second inductance connected in series with the reactance diode; and the portion of the microwave circuit constituted by the diode, the second inductance and the first capacitance forms a resonant circuit tuned to the frequency of the pump signal.

6 Claims, 5 Drawing Figures the coaxial cylinder capacitor $C_z=0.84$ pF (all dimensiones mm)

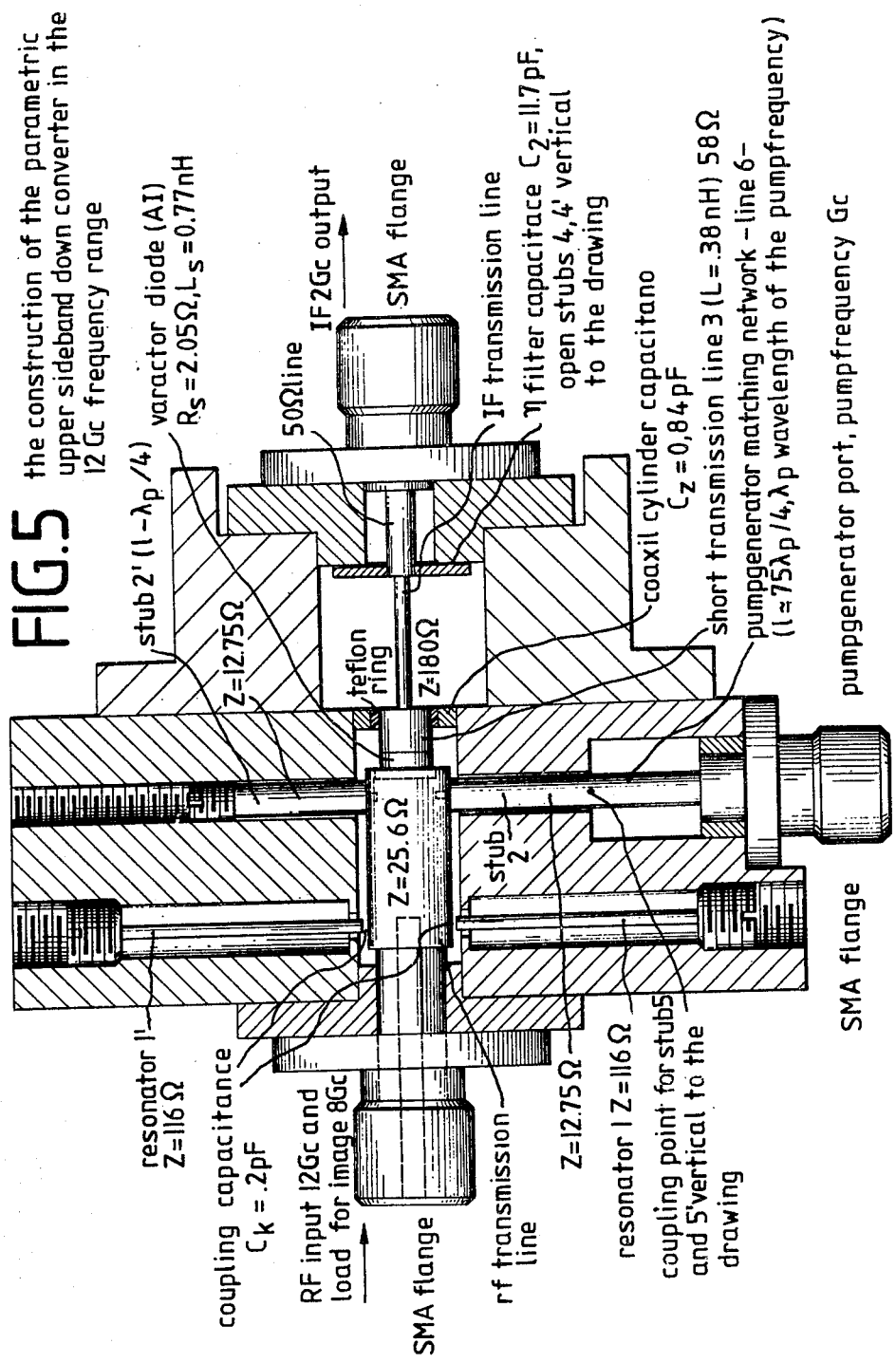

4,317,231

MICROWAVE CIRCUIT FOR A PARAMETRIC UPPER SIDEBAND DOWN CONVERTER

BACKGROUND OF THE INVENTION

The present invention relates to a microwave circuit for a parametric upper sideband down converter terminated at the image frequency by a real conductance and which has a parallel circuit at its input, an intermediate frequency (IF) circuit at its output, and a reactance diode coupling these circuits together.

The theoretical principles of operation and circuit variants for a parametric upper sideband down converter with real image frequency termination conductance and its interconnection with a prior art intermediate frequency amplifier are described in U.S. Pat. No. 3,991,373. The parametric upper sideband down converter discussed there is distinguished by conversion gain and, with the use of the real portion of the antenna impedance as the image frequency termination conductance, by an adaptivity with respect to the antenna temperature which, with low circuit and diode losses, permits the establishment of a quadrupole having a constant additional noise factor $F_z$ independent of the antenna temperature.

SUMMARY OF THE INVENTION

It is an object of the present invention to provide a circuit structure of a parameteric upper sideband down converter with real image frequency termination conductance which is suitable for use with microwaves.

This and other objects are accomplished according to the present invention by tuning the parallel circuit at the input of the circuit approximately to the pump frequency, tuning the reactance diode together with a series connected inductance to the pump frequency, and constructing the IF circuit at the output of the circuit as a $\pi$ filter with capacitances in the two transverse branches and an inductance in the longitudinal branch.

It is preferable to simulate the parallel circuit at the input of the circuit by means of two symmetrical, parallel connected stub lines each of a length of approximately $\lambda_p/4$ and the inductance connected in series with the reactance diode by a line of a length of approximately $\lambda_p/4$, where $\lambda_p$ is the transmission line wavelength at the pump frequency. It is further preferable to constitute the capacitance in a transverse branch of the $\pi$ filter as a coaxial cylinder capacitor on the line which constitutes the inductance that is connected in series with the reactance diode and to constitute the inductance in the longitudinal branch by two symmetrical, parallel connected $\lambda_p/4$ long, open stub lines which are disposed at a distance of $\lambda_p/4$ behind the line connected in series with the reactance diode. It is advantageous to dispose the capacitance in the form of a coaxial cylinder capacitor to be displaceable on the line connected in series with the reactance diode.

It is further desirable to couple the pump energy in through one of the two stub lines which are approximately $\lambda_p/4$ long, with the line being open-circuited, and two parallel short-circuited lines, one of the length $\lambda_{p+z}/2$ and the other of the length $\lambda_{p-z}/2$, and to couple the pump source with the coupling point by means of a transformation line.

BRIEF DESCRIPTION OF THE DRAWING

FIG. 5 is an elevational view, partly in cross section, showing the physical structure of a parametric upper sideband down converter according to the invention constructed to operate in the 12 GHz frequency range.

DESCRIPTION OF THE PREFERRED EMBODIMENTS

Figure 1:
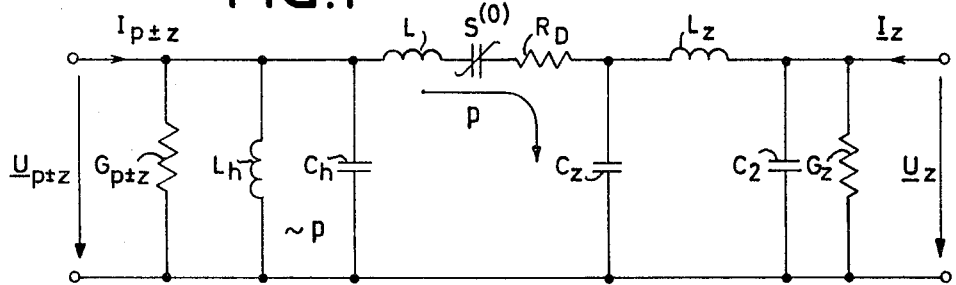
FIG. 1 is a circuit diagram for a preferred embodiment of a parametric upper sideband down converter with real image frequency termination conductance for microwaves according to the invention.

FIG. 1 shows the circuit for a parametric upper sideband down converter for use with microwaves, the pump circuit, which is connected in the conventional way, not being shown. The frequencies existing in this parametric upper sideband down converter are the pump frequency p, the intermediate frequency z, the signal frequency $p+z$ and the image frequency $p-z$.

Resonance tuning to the signal and image frequencies is effected by means of the parallel connected resonant circuit $L_h$, $C_h$ which is tuned approximately to the pump frequency and is disposed in the input of the circuit together with the series circuit tuned to the pump frequency that series circuit including an inductance L, the equivalent elastance $S^{(O)}$ and resistance $R_D$ of the reactance diode and a shunt capacitance $C_z$.

To resonance tune the converter, the parallel circuit $L_h$, $C_h$ at the input must be tuned to a frequency which is a few percent below the pump frequency.

The series circuit L, $S^{(\theta)}$, $C_z$ is tuned to the pump frequency p by suitable selection of the reactive elements of the reactance diode and the series inductance L which has been added to the series circuit. $S^{(\alpha)}$ ($\alpha = 0, 1, 2, \ldots$) are the Fourier coefficients of the elastance of the reactance diode.

The intermediate frequency circuit is designed as a $\pi$ filter composed of the elements $C_z$, $L_z$ and $C_2$ with the purpose of matching the load conductance $G_z$ to the output resonance conductance of the down converter.

The output conductance is the real conductance at resonance looking into the IF output port.

The conductance $G_{p+z}$ present at the input of the circuit is the real signal source conductance, $G_{p-z}$ is the circuit input conductance of the converter at the image frequency which, under the secondary condition of achieving a minimum noise factor, is not freely selectable.

Figure 2:
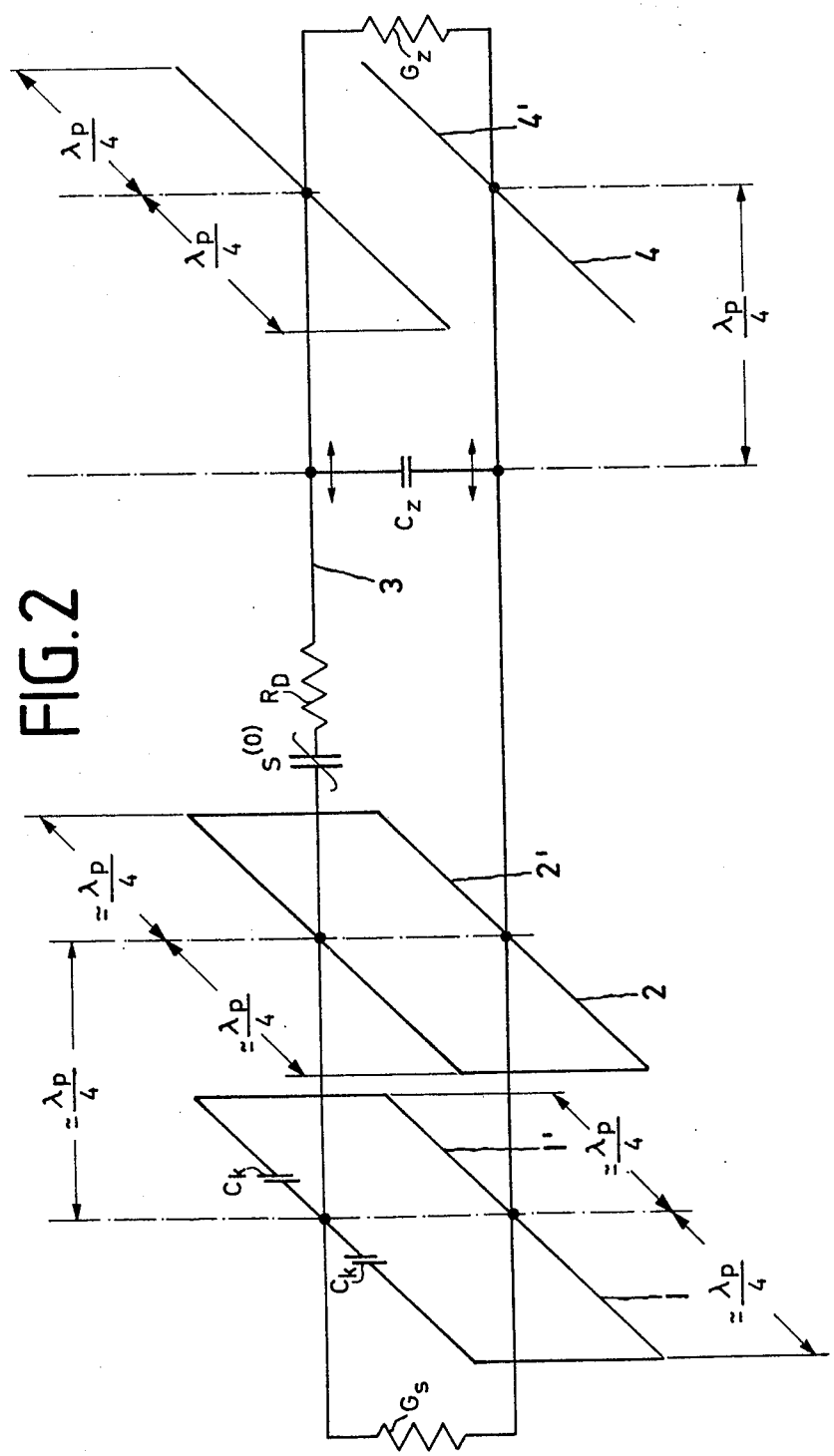
FIG. 2 shows a specific form of construction of the circuit of FIG. 1 utilizing transmission lines.

The microwave configuration is distinguished by strict symmetry of the individual structural components and essentially comprises interconnected transmission line pieces each of a length of $\lambda_p/4$. The microwave structure with the transmission line circuits shown in FIG. 2 results from the circuit of FIG. 1 when designed with lumped elements.

The parallel circuit $L_h$, $C_h$ provided at the input of the circuit is then replaced by two symmetrical, parallel connected stub lines 2 and 2' each having a length of approximately $\lambda_p/4$. The inductance L which is connected in series with the reactance diode is simulated by a length of line between the wires of which a capacitance $C_z$ disposed in a transverse branch of the $\pi$ filter, is displaceably arranged in the form of a coaxial cylinder capacitor. This permits fine tuning of the series resonant circuit comprising the elements of the reactance diode $S^{(0)}$, $R_D$, the inductance L and the capacitance $C_z$. The inductance L is here constituted by a transmission line section 3 of suitable length ahead of capacitor $C_z$. A pair of symmetrical, parallel connected stub lines 1, 1' each approximately $\lambda_p/4$ long and each including a capacitance $C_k$ are likewise disposed ahead of the pair of parallel connected stub lines 2, 2' at the input of the circuit. A transformation line between the two pairs of parallel connected stub lines 1, 1' and 2, 2' transforms the input conductances of the mixer in the upper or lower sideband, respectively, to the value of the antenna or generator conductance $G_s$ generally of the order of 20 mmho, which is common to both sidebands, this is based on the conventional 50 ohm system.

The capacitances $C_k$ connected in the two stub lines 1 and 1' together with the stub lines 1 and 1' are tuned to be series resonant over a narrow band for the pump frequency p and produce a short circuit at the input of the circuit for the pump frequency which is transformed over the $\lambda_p/4$ long transformation line into an open circuit which will not influence the pump series circuit existing there. The short circuit produced for the pump frequency at the input of the converter prevents radiation of pump energy through the antenna.

The two parallel connected stub lines 2,2' disposed in the input assure, together with the pump series circuit L, $R_D$, $S^{(O)}$, $C_z$, resonance tuning to the frequencies of the upper or lower sideband p+z, respectively, as well as to the pump frequency p and produce the short circuit for the intermediate frequency required to decouple the high frequency and intermediate frequency circuit portions.

The coaxial cylinder capacitor $C_z$ which is displaceably arranged on the line 3 representing the inductance is part of the $\pi$ filter tuned to the intermediate frequency z which permits matching to the load conductance $G_z$.

The second $\pi$ filter capacitor $C_2$ and inductor $L_z$ are constituted by a series transformation line section having a length of $\lambda_p/4$ and a pair of symmetrical, parallel connected open-circuited stub lines 4, 4', each $\lambda_p/4$ in length which short circuit a pump signal that might be present at the IF output, which output is located at the points of connection of lines 4, 4'. The short circuit for the pump frequency produced at the IF terminals is transformed by the IF transformation line $\lambda_p/4$ in length, which extends between the parallel connected lines 4, 4' that are $\lambda_p/4$ in length and the line 3, into an open circuit and here does not influence the high frequency circuit.

Figure 3:
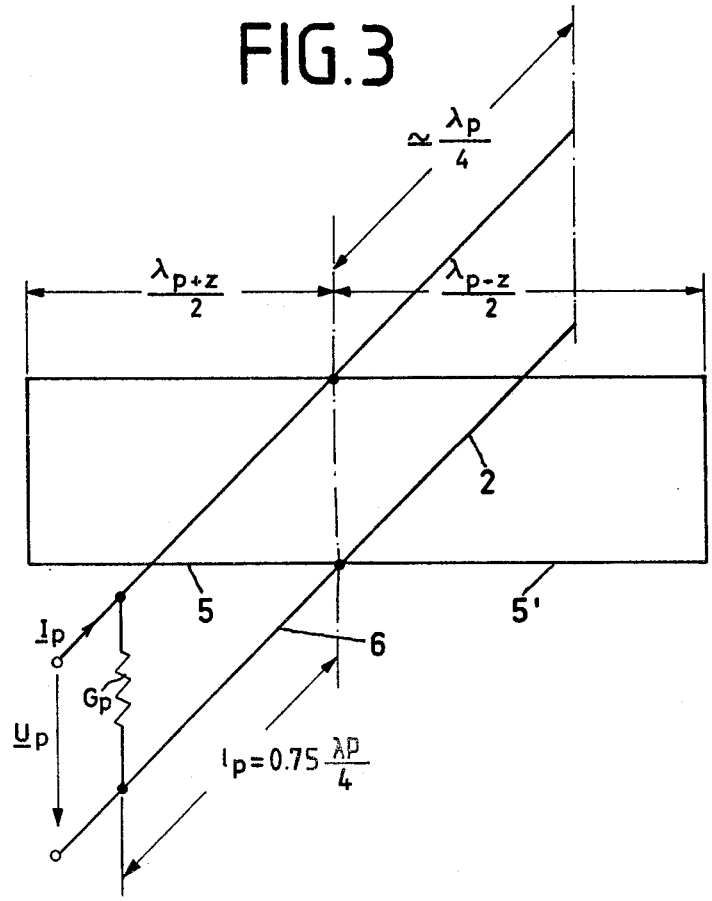
FIG. 3 shows a transmission line unit for supplying pump energy for the upper sideband down converter.

FIG. 3 shows a line structure for coupling the pump signal in at one of the two parallel connected stub lines 2 or 2'. For this purpose, the stub line is open at its end, where it was previously short-circuited. At this coupling point, two parallel, short-circuited stub lines 5 and 5' are connected, one having the length $\lambda_{p+z}/2$ and the other having the length $\lambda_{p-z}/2$. The pump source $G_p$ is connected with the coupling point via a transformation line 6.

Figure 4:
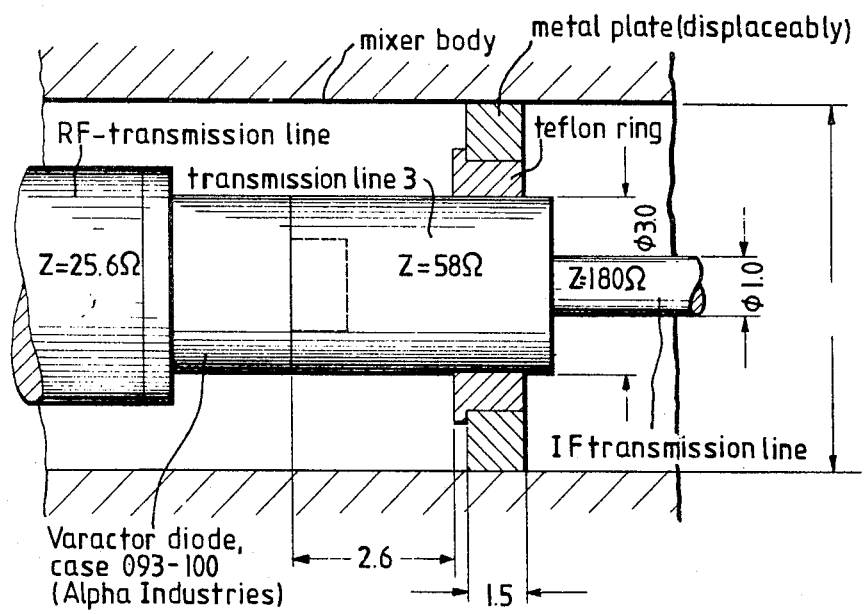
FIG. 4 is a side view, partly in cross section, of an embodiment of a cylinder capacitor employed in the circuit of FIG. 2.

The reactance diode utilized in a GaS diode of the type DVE 6347B with a case type 093-100 manufactured by Alpha Industries. As one example of the physical structure of the coaxial cylinder capacitor, see FIG. 4.

It will be understood that the above description of the present invention is susceptible to various modifications, changes and adaptations, and the same are intended to be comprehended within the meaning and range of equivalents of the appended claims.

What is claimed is:

1. In a microwave circuit for a parametric upper sideband down converter with real image frequency termination conductance, including a pump circuit supplying a pump signal, a parallel circuit at its input, an intermediate frequency circuit at its output, and a reactance diode coupling the parallel circuit and intermediate frequency circuit together, the improvement wherein said parallel circuit is tuned approximately to the frequency of said pump signal; said intermediate frequency circuit comprises a $\pi$ filter composed of a series branch containing a first inductance connected in series between said diode and the output of said microwave circuit, a first shunt branch located between said diode and said inductance and containing a first capacitance and a second shunt branch located between said inductance and the output of said microwave circuit and containing a second capacitance; said microwave circuit further comprises a second inductance connected in series with said reactance diode; and the portion of said microwave circuit constituted by said diode, said second inductance and said first capacitance is tuned to the frequency of said pump signal.

2. Microwave circuit as defined in claim 1 wherein said parallel circuit comprises two symmetrical, parallel connected stub lines each having a length equal to approximately $\lambda_p/4$, where $\lambda_p$ is the pump frequency wavelength in said microwave circuit.

3. Microwave circuit as defined in claim 2 wherein one of said stub lines is open-circuited, and said pump circuit comprises: two parallel, short-circuited transmission line sections, connected to the end of said one of said stube lines, with one of said line sections having a length of $\lambda_{p+z}/2$, where $\lambda_{p+z}$ is the wavelength, in said microwave circuit, of a signal at a frequency equal to the sum of the pump frequency and intermediate frequency, and the other of said sections having a length of $\lambda_{p-z}/2$, where $\lambda_{p-z}$ is the wavelength, in said microwave circuit, of a signal at a frequency equal to the difference between the pump frequency and the intermediate frequency; a pump signal source; and a transformation line connecting said signal source to the end of said one of said stub lines.

4. Microwave circuit as defined in claim 1 wherein said second inductance connected in series with said diode is constituted by a length of transmission line.

5. Microwave circuit as defined in claim 4 wherein said first capacitance comprises a coaxial cylinder capacitor in said length of transmission line; said second capacitance and said first inductance are constituted by two symmetrical, parallel connected, open-circuited stub lines each having a length equal to $\lambda_p/4$, where $\lambda_p$ is the pump frequency wavelength, and a second length of transmission line connected in series between said first recited length of line and said open-circuited stub lines and having a length of $\lambda_p/4$.

6. Microwave circuit as defined in claim 5 wherein said coaxial cylinder capacitor is displaceable along said lengths of transmission line.

* * * * *